(12) United States Patent
Gagnon et al.

(10) Patent No.: US 11,228,843 B2
(45) Date of Patent: Jan. 18, 2022

(54) ELECTRICALLY ISOLATED DEVICE FOR PROVIDING A SUB-THRESHOLD CONDUCTION PATH FOR LEAKAGE CURRENT ACROSS A PIEZOELECTRIC TRANSDUCER

(71) Applicant: Vesper Technologies Inc., Boston, MA (US)

(72) Inventors: Ronald Gagnon, Boston, MA (US); Chen-Wei Huang, Boston, MA (US)

(73) Assignee: Vesper Technologies Inc., Boston, MA (US)

( * ) Notice: Subject to any disclaimer, the term of this patent is extended or adjusted under 35 U.S.C. 154(b) by 457 days.

(21) Appl. No.: 16/334,678

(22) PCT Filed: Oct. 6, 2017

(86) PCT No.: PCT/US2017/055497
§ 371 (c)(1),
(2) Date: Mar. 19, 2019

(87) PCT Pub. No.: WO2018/067907
PCT Pub. Date: Apr. 12, 2018

(65) Prior Publication Data
US 2021/0306759 A1    Sep. 30, 2021

Related U.S. Application Data

(60) Provisional application No. 62/405,597, filed on Oct. 7, 2016.

(51) Int. Cl.
*H04R 17/02* (2006.01)
*H04R 3/00* (2006.01)
(Continued)

(52) U.S. Cl.
CPC ........... *H04R 17/02* (2013.01); *H01L 41/042* (2013.01); *H03F 3/187* (2013.01); *H04R 3/00* (2013.01); *H03F 2200/03* (2013.01)

(58) Field of Classification Search
CPC ........ H03F 3/45179; H03F 3/505; H04R 3/00
(Continued)

(56) References Cited

U.S. PATENT DOCUMENTS 8,531,088 B2    9/2013    Grosh et al.
8,766,703 B1    7/2014    Yang et al.
(Continued)

FOREIGN PATENT DOCUMENTS

KR    10-0137394    12/2010

OTHER PUBLICATIONS

PCT International Preliminary Report on Patentability in International Appln. No. PCT/US2017/055497, dated Apr. 9, 2019, 7 pages.
(Continued)

*Primary Examiner* — George C Monikang
(74) *Attorney, Agent, or Firm* — Fish & Richardson P.C.

(57) ABSTRACT

A device includes: a piezoelectric transducer; a field effect transistor (FET) configured to provide a sub-threshold conduction path for leakage current across the piezoelectric transducer; wherein the FET comprises a gate; wherein each of a width and a length of the gate has a size in accordance with the sub-threshold conduction path being configured to substantially maintain an input voltage to the piezoelectric transducer across a path of the leakage current of the piezoelectric transducer.

21 Claims, 8 Drawing Sheets

(51) Int. Cl.
*H03F 3/187* (2006.01)
*H01L 41/04* (2006.01)

(58) Field of Classification Search
USPC .................................................. 381/111–115
See application file for complete search history.

(56) References Cited

U.S. PATENT DOCUMENTS

2009/0279719 A1  11/2009  Lesso
2013/0070365 A1   3/2013  Hogg
2013/0279721 A1  10/2013  David et al.

OTHER PUBLICATIONS

ISA/KR, International Search Report for PCT/US2017/055497 (dated Apr. 30, 2018).

ELECTRICALLY ISOLATED DEVICE FOR PROVIDING A SUB-THRESHOLD CONDUCTION PATH FOR LEAKAGE CURRENT ACROSS A PIEZOELECTRIC TRANSDUCER

CLAIM OF PRIORITY

This application claims priority under 35 U.S.C. § 119(e) to provisional U.S. Patent Application 62/405,597, filed on Oct. 7, 2016, the entire contents of which are hereby incorporated by reference.

SUMMARY

In one aspect, a device includes a piezoelectric transducer; a field effect transistor (FET) configured to provide a sub-threshold conduction path for leakage current across the piezoelectric transducer; wherein the FET comprises a gate; wherein each of a width and a length of the gate has a size in accordance with the sub-threshold conduction path being configured to substantially maintain an input voltage to the piezoelectric transducer across a path of the leakage current of the piezoelectric transducer. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In some aspects, the piezoelectric transducer is associated with a leakage resistance (Rm) that produces the leakage current, when in operation; wherein each of the width and the length of gate is of a size for producing a sub-threshold drain current (ID) of the FET that is substantially in accordance with the leakage current. The FET is configured to provide the sub-threshold conduction by each of the width and the length of the gate being of a size for producing the sub-threshold drain current (ID) of the FET that is substantially in accordance with the leakage current. The FET is configured to act as a switch with an on state and an off state. The FET is configured, when in the on state, to provide a lower impedance path between the input voltage and a reference voltage, relative to an impedance of the path between the input voltage and the reference voltage, when the FET is in the off state, to provide for charging of the piezoelectric transducer. The FET is configured, when in the off state, to provide the sub-threshold conduction path. The actions include a reference voltage source for providing a reference voltage; and an amplifier configured for operation at the reference voltage or at another voltage within a predefined range of the reference voltage; wherein each of the width and the length of the gate have a size in accordance with the sub-threshold conduction path being configured to substantially maintain the input voltage at the reference voltage. The piezoelectric transducer comprises a beam with a first electrode layer, a piezoelectric layer and a second electrode layer, wherein a top surface of the beam is associated with surface conduction that causes the leakage current across the piezoelectric transducer when the piezoelectric transducer is under bias. A leakage current across the piezoelectric transducer is associated with the reference voltage. The piezoelectric transducer comprises a first plate and a second plate, and wherein a leakage current is associated with a voltage differential across the first and second plates. The piezoelectric transducer comprises a beam with a first electrode layer, a piezoelectric layer and a second electrode layer, wherein a material property of the piezoelectric layer causes the leakage current across the piezoelectric transducer. The piezoelectric transducer comprises: a piezoelectric sensor; a piezoelectric resonant sensor; an acoustic transducer; a pressure sensor; a chemical sensor; an ultrasonic sensor; or an inertial sensor. The device comprises an acoustic device, a microphone or a hydrophone. The actions include a gate drive circuit configured to deliver a voltage to gate of the FET to charge a capacitance of the piezoelectric transducer. The actions include an amplifier; and one or more electrostatic discharge (ESD) diodes to protect the amplifier from ESD.

In another aspect, a device includes an integrated circuit; a piezoelectric transducer on the integrated circuit; and input bias circuitry on the integrated circuit, wherein the input bias circuitry is electrically isolated from the piezoelectric transducer, and wherein the input bias circuitry is configured to maintain one or more steady state operating characteristics of the piezoelectric transducer by providing a sub-threshold conduction path for sub-threshold current of the piezoelectric transducer. Other embodiments of this aspect include corresponding computer systems, apparatus, and computer programs recorded on one or more computer storage devices, each configured to perform the actions of the methods.

In this aspect, at least one of the one or more steady state operating characteristics includes an input voltage of the piezoelectric transducer being in accordance with a reference voltage of the device. The input voltage of the piezoelectric transducer being in accordance with the reference voltage of the device comprises the input voltage of the piezoelectric transducer being substantially equal to a reference voltage of the device.

In another aspect, a method includes providing, by a field effect transistor, a sub-threshold conduction path for leakage current across a piezoelectric transducer; and maintaining an input voltage to the piezoelectric transducer across a path of the leakage current of the piezoelectric transducer; wherein each of a width and a length of a gate of the field effect transistor has a size in accordance with the sub-threshold conduction path being configured to substantially maintain the input voltage to the piezoelectric transducer across the path of the leakage current of the piezoelectric transducer. Other embodiments of this aspect include corresponding computer systems, apparatus, and computer programs recorded on one or more computer storage devices, each configured to perform the actions of the methods. The actions include causing the leakage current to flow through the sub-threshold conduction path. Maintaining comprises: supplying a reference voltage to the field effect transistor; and maintaining the input voltage to be in accordance with the reference voltage.

Other features and advantages of the invention will become apparent from the following description, and from the claims.

DETAILED DESCRIPTION

A device consistent with this disclosure provides an input biasing scheme for a piezoelectric Microelectromechanical systems (MEMS) transducer made up of one or more isolated field-effect transistors (FET(s)), allowing for input bias stability as well as fast charging of an input node (e.g., an acoustic transducer, a piezoelectric acoustic transducer, and so forth) during power-up, mode transitions, or recovery from power loss. Generally, bias includes direct current (DC) deliberately made to flow, or DC voltage deliberately applied, between two points for the purpose of controlling a circuit. In this example, the FET is configured to function as a switch to charge the capacitance of the piezoelectric MEMS transducer and function as a sub-threshold conduction path to stabilize the DC voltage across the piezoelectric MEMS transducer leakage path during operation, while maintaining a high impedance across the piezoelectric MEMS transducer, optimizing the operating point for low noise operation. In an example, the switch can be realized by an isolated device (e.g., PMOS (p-type Metal-Oxide Semiconductor Field-Effect Transistor) and/or Deep N-Well isolated NMOS (n-type Metal-Oxide Semiconductor Field-Effect Transistor)) and the conduction path can be realized by the sub-threshold conduction of those isolated device(s), or by leakage currents of isolated junctions realized by either lateral or vertical PN junctions, realized as diodes or bipolar junction transistors (BJT).

Figure 1:
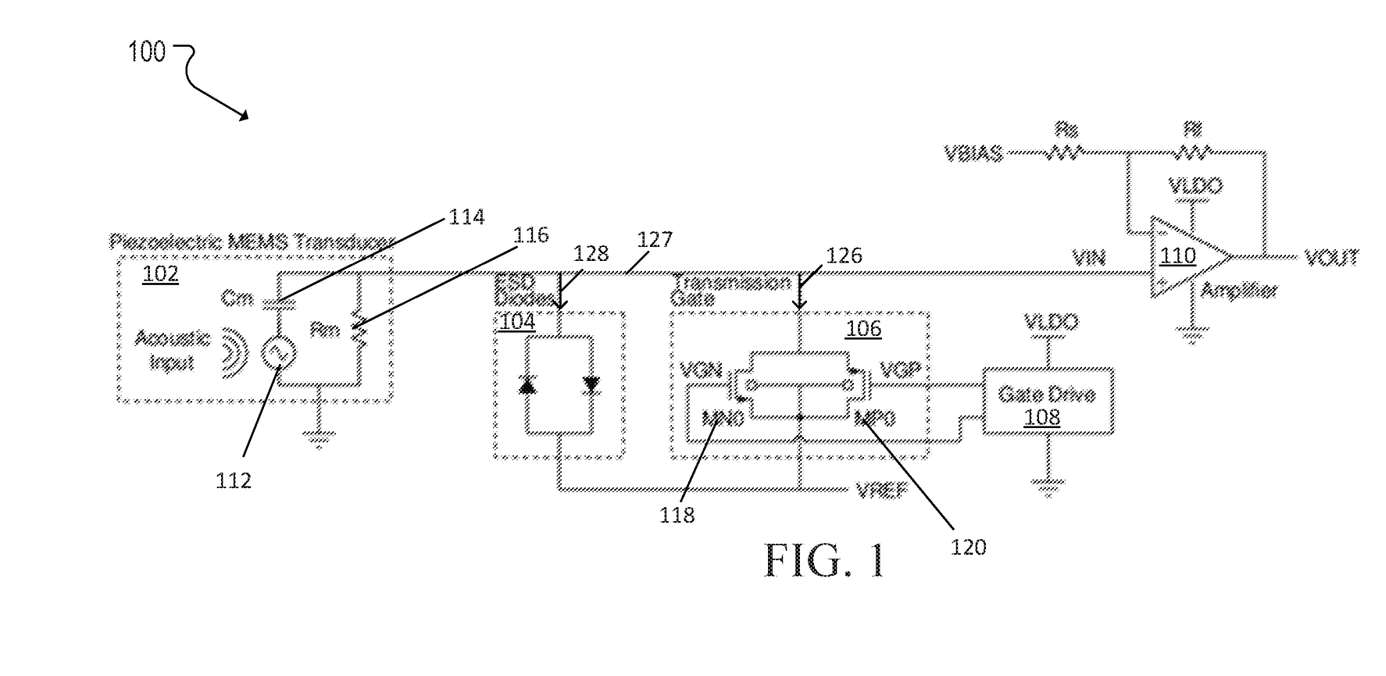
FIGS. 1-2 are each diagrams of input bias circuitry for a piezoelectric transducer.

Referring to FIG. 1, equivalent circuit diagram 100 illustrates an equivalent circuit for a device (e.g., a package device) including a transducer, amongst other features. Equivalent circuit diagram 100 includes (via representation of the equivalent circuits for each of the following components) transducer 102, electrostatic discharge (ESD) diodes 104 (e.g., to protect the amplifier), input bias circuitry or transmission gate device 106, gate drive 108 and amplifier 110. In an example, the foregoing components and devices are connected to or otherwise on an integrated circuit. In an example, the input bias circuitry is electrically isolated on the integrated circuit from the piezoelectric transducer. In this example, the input bias circuitry is configured to maintain one or more steady state operating characteristics of the transducer by providing a sub-threshold conduction path for sub-threshold current of the piezoelectric transducer. At least one of the one or more steady state operating characteristics includes an input voltage of the piezoelectric transducer being in accordance with a reference voltage of the device depicted in diagram 100.

Transducer 102 includes a piezoelectric transducer, a piezoelectric MEMS transducer, an acoustic transducer, an acoustic piezoelectric MEMS transducer, and so forth. In this example, transducer 102 includes at least a first plate and a second plate (not shown), e.g., as described in U.S. Pat. No. 8,531,088, the entire contents of which are incorporated herein by reference. Transducer 102 is modeled as voltage source 112 (e.g., the piezoelectric transduction element), in series with capacitor 114, Cm, and leakage resistance 116, $R_M$, in parallel with those series elements. In this example, transducer 102 includes a piezoelectric transducer that has the leakage resistance. In this example, the piezoelectric transducer includes a beam with a first electrode layer, a piezoelectric layer and a second electrode layer, wherein a top surface of the beam is associated with surface conduction that causes the leakage resistance and this the leakage current across the piezoelectric transducer. In another example, a material property of the piezoelectric layer causes the leakage current across the piezoelectric transducer. In an example, a leakage current across the piezoelectric transducer is associated with the reference voltage. In yet another example, the piezoelectric transducer includes a first plate and a second plate, and a leakage current is associated with a voltage differential across the first and second plates.

The biasing device shown here is transmission gate device 106, including NMOS 118 and PMOS transistor 120 wired in parallel. NMOS 118 includes a triple-well device. For example, NMOS 118 is constructed in an isolated Deep N-Well (DNW), with a body bias that can be separated from the surrounding substrate. The body connections for both the DNW NMOS 118 and PMOS 120 are driven by a reference voltage, VREF, provided by a reference voltage source.

Figure 4:
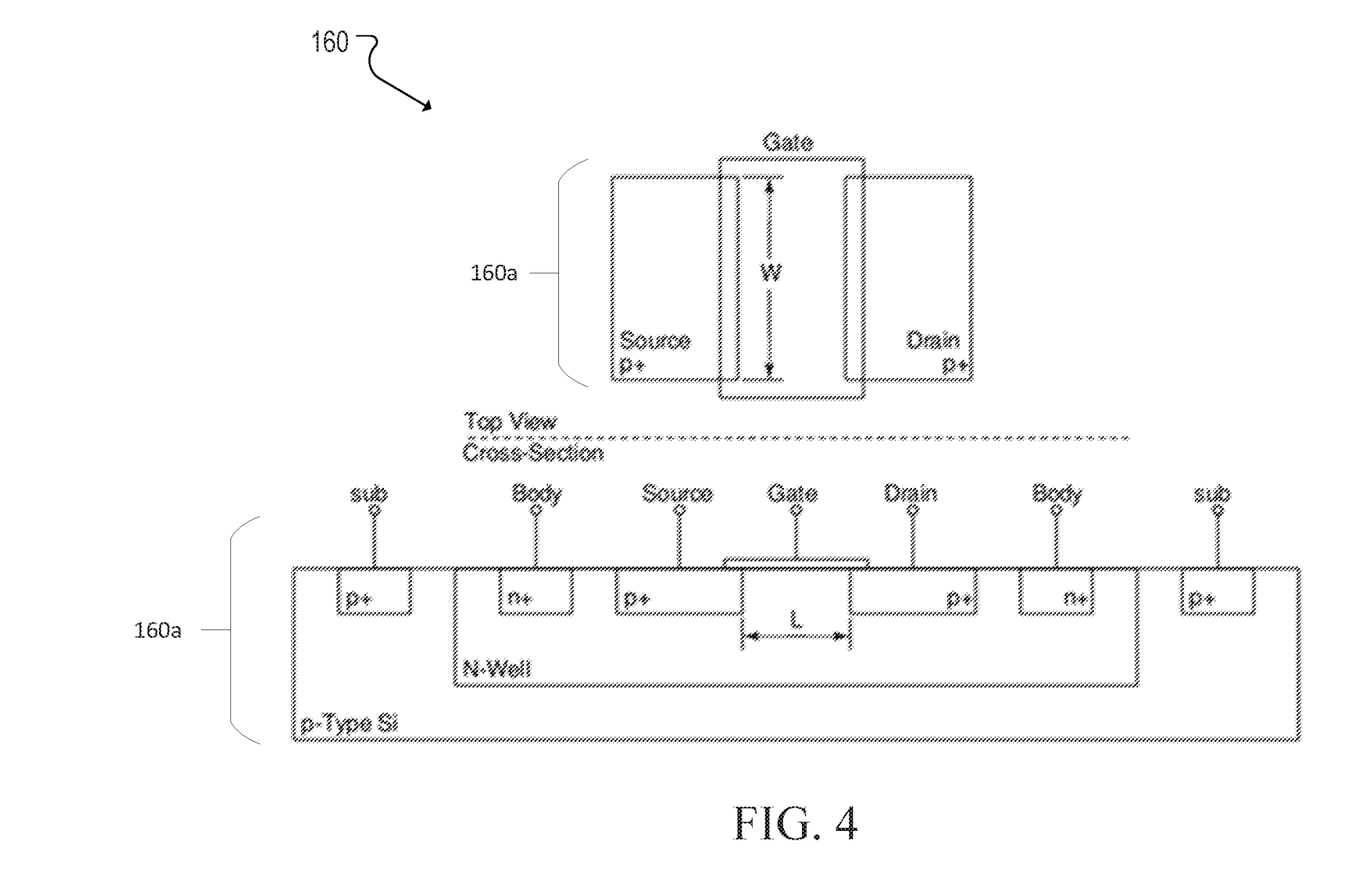

In this example, leakage resistance 116 generates a leakage current, in accordance with Ohm's law. In order for the leakage current to not affect the input voltage, the leakage current is conducted through a conduction path such that the input voltage to transducer 102 can substantially equal a reference voltage of the device—for optimal performance of amplifier 110. In this example, amplifier 111 is configured for operation at the reference voltage of at another voltage within a predefined range of the reference voltage. In this example, ESD diodes 104 provide conduction path 128. This conduction path 128 is not strong enough to account for the leakage current cause by leakage resistance 116. Accordingly, transmission gate 106 provides conduction path 126 (e.g., a sub-threshold conduction path) for the leakage current caused by resistance leakage 116. In this example, the leakage current is sub-threshold drain current ($I_D$) of transmission gate 106. Transmission gate needs to be sized with a gate length (L) and a gate width (W) to accommodate a sub-threshold drain current ($I_D$) or leakage current that is in accordance with the leakage resistance 116, as described in further detail below, such that the input voltage equals or substantially equals a reference voltage of the device. The size of the gate, length L, is the distance between source and drain. The width is the extension of the transistor, e.g., as shown in FIG. 4. Each of a width and a length of the gate 126 has a size in accordance with the sub-threshold conduction path being configured to substantially maintain an input voltage to the piezoelectric transducer across a path (e.g., path 127) of the leakage current of the piezoelectric transducer.

In this example, each of the width and the length of gate is of a size for producing a sub-threshold drain current ($I_D$) of the FET that is substantially in accordance with the leakage current, as described in further detail below. In this example, the FET is configured to provide the sub-threshold conduction by each of the width and the length of the gate being of a size for producing the sub-threshold drain current ($I_D$) of the FET that is substantially in accordance with the leakage current.

The gates of the DNW NMOS and PMOS devices 118, 120, respectively, are driven by gate drive circuit 108 (hereinafter gate drive 108). Gate drive 108 is configured to deliver a voltage to gate of the FET to charge a capacitance of the piezoelectric transducer. During power-up, mode transitions, or recovery from a loss of power, gate drive 108 turns transmission gate 106 "On", creating a low (or lower) impedance path between an input voltage (VIN) and a reference voltage (VREF). This allows the capacitor 114, Cm, of transducer 102, to be charged quickly, on the order of microseconds, to a bias voltage suitable for a nominal operating state of amplifier 110. In this example, a lower impedance path between the input voltage and a reference voltage is relative to an impedance of the path between the input voltage and the reference voltage, when the FET is in the off state. Gate drive 108 further switches the gates of DNW NMOS and PMOS 118, 120, respectively, to the same VREF voltage when transmission gate 106 is "Off." By doing so, both the DNW NMOS and PMOS devices 118, 120, respectively, conduct in the sub-threshold region, and provide a conduction path to maintain a bias voltage on VIN, and operation of amplifier 110. This is required due to the leakage resistance 116, Rm, across transducer 102. Elements (e.g., such as the width and length) of transmission gate 106 are determined (e.g., optimized) to balance their conduction strength so as to maintain VIN as close to VREF as possible. Optimization (e.g., determination of values of the width and the length) depends on the value of Rm as well, as the voltage divider realized by Rm and the effective impedance of transmission gate 106 determines the final value of VIN.

Figure 2:
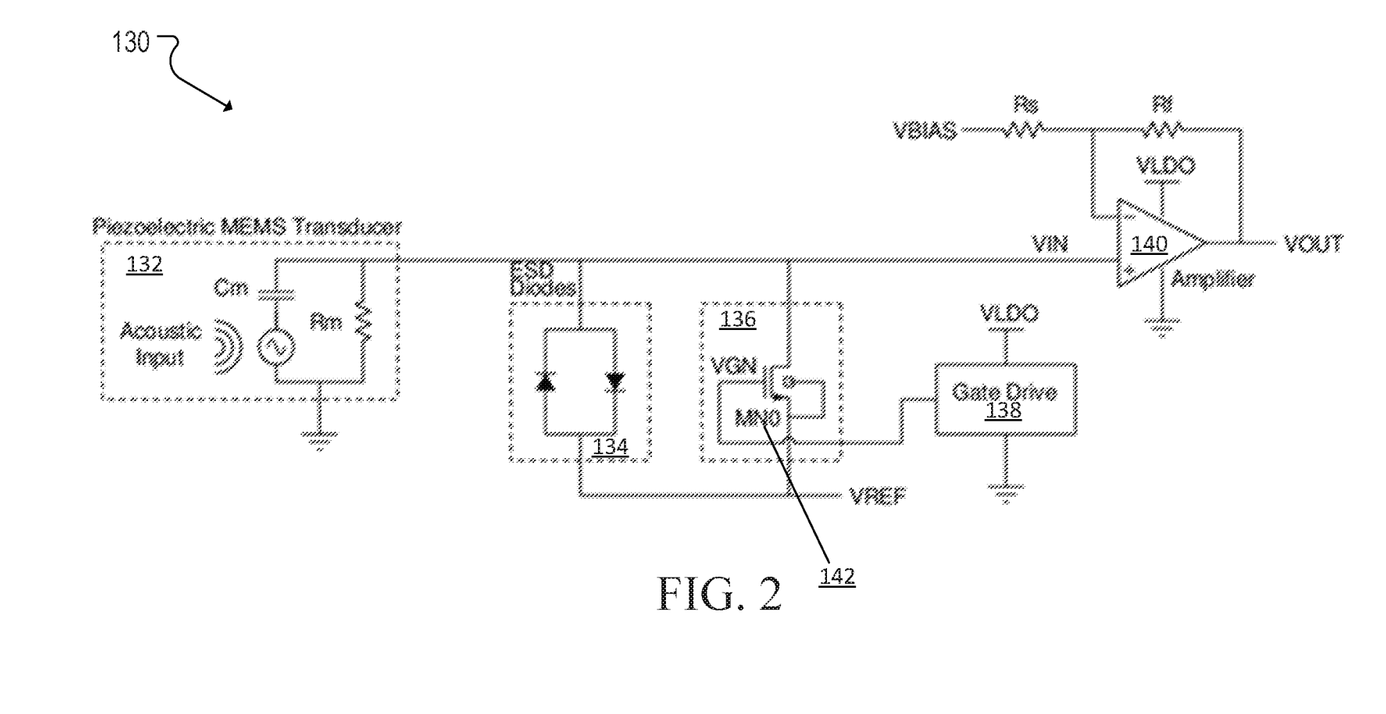

Referring to FIG. 2, equivalent circuit diagram 130 illustrates that other devices can be used to realize the operations described with reference to FIG. 1. In this example, equivalent circuit diagram 130 includes transducer 132, ESD diodes 134, transmission gate 136, gate drive 138 and amplifier 140. In this example, transmission gate 136 includes a single NMOS device 142. In other examples (not shown), transmission gate includes a single PMOS device, a single DNW-NMOS device, isolated PN junctions, etc. The implementation of each of these components would affect operation depending on the voltage levels desired for VIN. Also, startup and recovery modes are determined (e.g., optimized) based on the device utilized for transmission gate or switch, specifically gate drive voltages and timing of those signals, as described in further detail below.

In an example, the gate drive and VREF voltages can also be implemented as a configurable block. If the device, i.e., a microphone, a piezoelectric MEMS microphone, and so forth, required multiple modes that required different biasing conditions for VIN, the voltages driving both VREF and the Gate Drive circuit can be configured based on that mode through transmission gates or switches. Those switches would be optimized to neglect their ability to impact overall performance when compared to a device that did not have multiple operating modes.

In another variation, the piezoelectric MEMS transducer is configured to be referenced to VREF instead of to ground as shown in FIGS. 1 and 2. This configuration allows for configuration (e.g., optimization) of the gate drive block to turn the switch "off" to a very high impedance. The VIN bias stability is then a function of the VREF stability, but the noise is now determined by the noise on VREF. For low noise operation, this signal needs to be optimized to meet the noise requirements of the device.

Subthreshold Operation for VIN Bias Stability:

The sub-threshold drain current is given by equation 1. It is exponentially related to both the $V_{GS}$ and $V_{DS}$ terminal voltages. The body effect, from Source to Body, can be neglected as those terminals are tied together. The Drain to Body current will be the reverse current leakage through the junction diode of the drain diffusion, and is orders of magnitude lower than the sub-threshold conduction current, and for this analysis is neglected.

In one operational state of a FET, $V_{GS} < V_{TH}$. In this state, the sub-threshold drain current $I_D$, when ($V_{GS} < V_{TH}$) is represented in accordance with equation 1.

$$I_D = I_{D0} \frac{W}{L} e^{\frac{V_{GS}}{nV_t}} \left(1 - e^{\frac{V_{DS}}{V_t}}\right) \quad \text{Equation 1}$$

where $$I_{D0} = \mu_n C_{OX} (n-1) V_t^2 e^{\frac{-V_{TH}}{nV_t}}$$

$$V_t = \frac{kT}{q}$$

$$n = \frac{C_{OX} + C_{DEPL}}{C_{OX}}$$

In the foregoing equation, $V_{DS}$ is the drain-to-source voltage of a FET and $V_{GS}$ is the gate-to-source voltage of the FET. In this example, the current ($I_D$) through the conduction path is determined such that yin substantially equals $V_{ref}$, e.g., by using an optimizer system that determines values of the width (W) and the length (L) of the FET such that $I_D$ allows for yin to substantially equal $V_{ref}$. In this example, a magnitude of $I_D$ is dependent on the magnitude of the leakage resistance (Rm) such that increases in the leakage resistance result in a smaller magnitude of $I_D$ to maintain Vin substantially equal to the reference voltage $V_{Ref}$ in accordance with Ohm's law. In particular, each of a width and a length of the gate has a size in accordance with the sub-threshold conduction path being configured to substantially maintain an input voltage to the piezoelectric transducer across a path (e.g., path 127 in FIG. 1) of the leakage current of the piezoelectric transducer.

The $I_{D0}$ term in the equation is comprised of several variables as seen in Equation 1. Mobility ($\mu_n$), oxide capacitance ($C_{OX}$), threshold voltage ($V_{TH}$), and n are process specific parameters. The parameter n is typically around 1.5 for advanced CMOS nodes and is the ratio of the oxide capacitance to the depletion capacitance ($C_{DEPL}$). The thermal voltage ($V_T$) is derived from Boltzmann's constant (k), the ambient temperature in Kelvin (T), and the elemental charge, q, and at 300° K has the value of 25.6 mV.

In order to have the VDS terminal voltage control the sub-threshold drain current, the Gate Terminal is tied to the same VREF potential as the Source Terminal. This removes the exponential dependence on the VGS terminal voltage and we are left simply with the VDS terminal controlling the sub-threshold drain current as shown in Equation 2.

In another operational state of a FET, the $V_{GS}=0$. In this state, Sub-Threshold Drain Current $I_D$, when ($V_{GS}=0$), is determined in accordance with Equation 2:

$$I_D = I_{D0} \frac{W}{L} \left(1 - e^{-\frac{V_{DS}}{V_t}}\right) \quad \text{Equation 2}$$

The optimization requires that we have a leakage path across the piezoelectric transducer. This leakage path, and the sub-threshold current path across the biasing device, will determine the DC operating point across the piezoelectric transducer.

The effective impedance through the biasing element is given by equation 3 and equation 4. The transconductance across the $V_{DS}$ terminal is simply the derivative of the drain current with respect to the $V_{DS}$ terminal voltage. The reciprocal of this transconductance gives the effective impedance across the biasing element.

Assuming $V_{GS}=0$ $$g_{DS} = \frac{\partial I_D}{\partial V_{DS}} = I_{DO}\frac{W}{L}e^{-\frac{V_{DS}}{V_t}} \quad \text{Equation 3}$$

$$R_{DS} = \frac{1}{g_{DS}} \quad \text{Equation 4}$$

Using the foregoing equations, values for a width (W) and a length (L) of a channel of a FET (e.g., a transmission gate) are determined such that a sub-threshold conduction path of the FET is configured for a leakage current in accordance with Rm.

Figure 3:
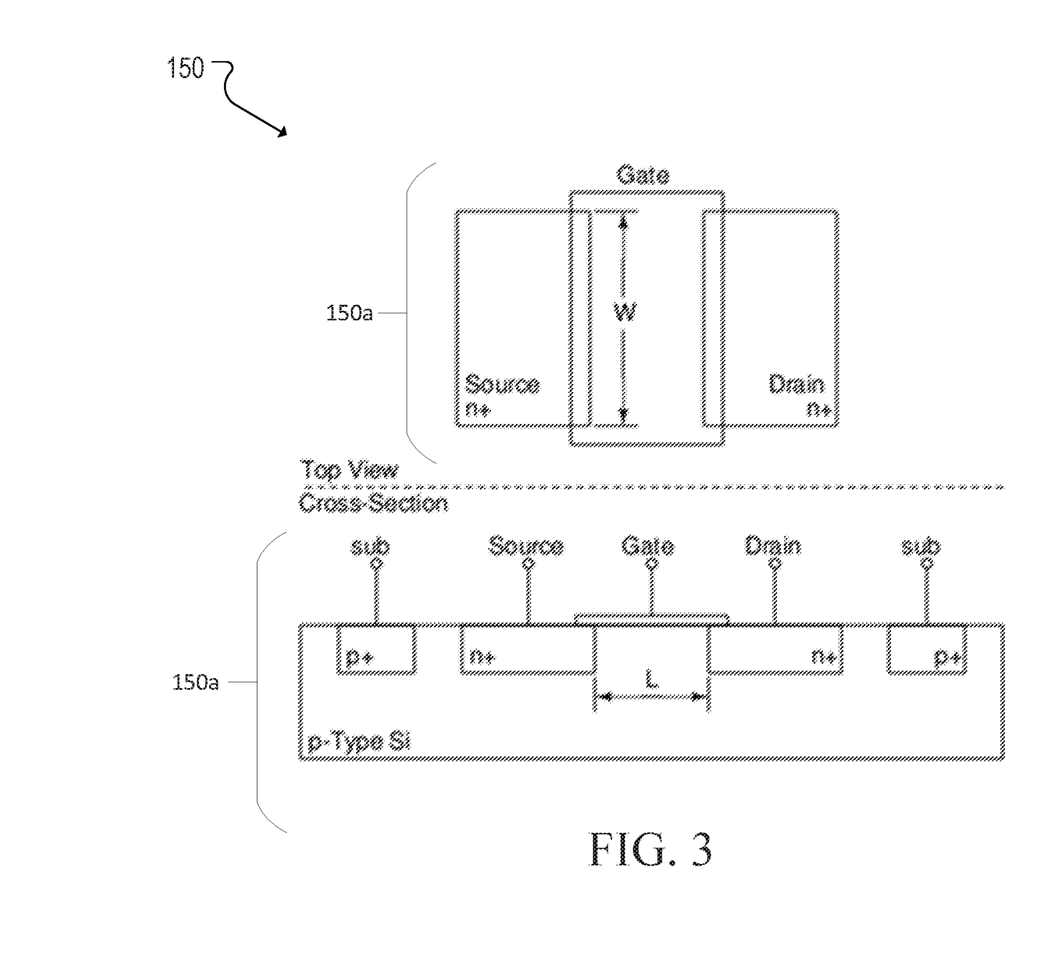
FIGS. 3-5 are each top views and cross section views of field effect transistors.
Figure 5:
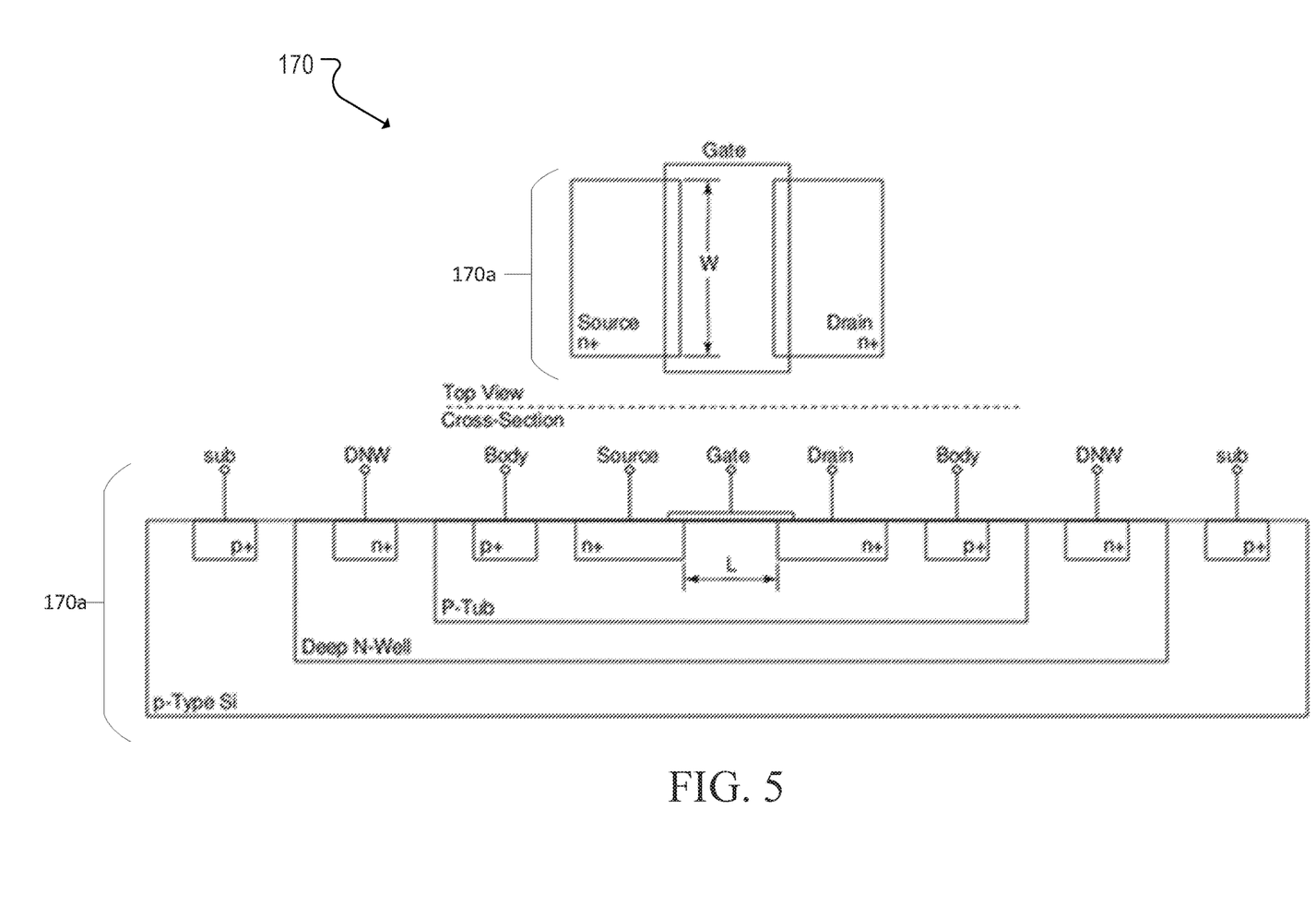

Referring to FIG. 3, diagram 150 shows a top view with the physical dimension of W of an NMOS device 150a and a cross-section view with the physical dimension of L of the NMOS device. Referring to FIG. 4, diagram 160 shows a top view with the physical dimension of W of a PMOS device 160a and a cross-section view with the physical dimension of L of the PMOS device 160a. Referring to FIG. 5, diagram 170 shows a top view with the physical dimension of W of a Deep-N-Well NMOS device 170a and a cross-section view with the physical dimension of L of the Deep-N-Well NMOS device 170a.

Also shown in one or more of FIGS. 3-5 are the location of Well Ties, physical connections for biasing of devices, and Substrate Ties, as well as the location of Gate, Source, and Drain for each device type. As described above, VGS is the voltage between Gate and Source, while VDS is the voltage between Drain and Source shown in the cross section FIGS. 3-5.

In an example, a biasing scheme includes a $V_{GS}$ terminal voltage of zero. In this example, the gate of the device (e.g., a transmission gate or a single FET device) is biased at $V_{REF}$, and the W/L ratio is determined (e.g., optimized) to achieve desired sub-threshold current levels, which sets the effective impedance through the biasing element (e.g., a transmission gate or a single FET device), and in concert with the leakage impedance through the piezoelectric transducer, sets the DC operating point across the piezoelectric transducer.

The final optimization, after determining an optimal DC operating point, is too maximize the size of $R_{DS}$, given in Equation 4 and derived from Equations 1-3 so as to minimize the effect of noise from the transmission gate. The effective value of $R_{DS}$ filters its self noise in concert with the transducer capacitance, $C_M$. By increasing or maximizing the value of $R_{DS}$, the self noise is minimized. This optimization is done in light of the other dominant noise sources, particularly the input referred noise of the amplifier, and any self noise of the transducer, so that the self noise of $R_{DS}$ does not contribute significantly to the overall noise of the circuit, thus maximizing the signal to noise ratio (SNR).

Figure 6:
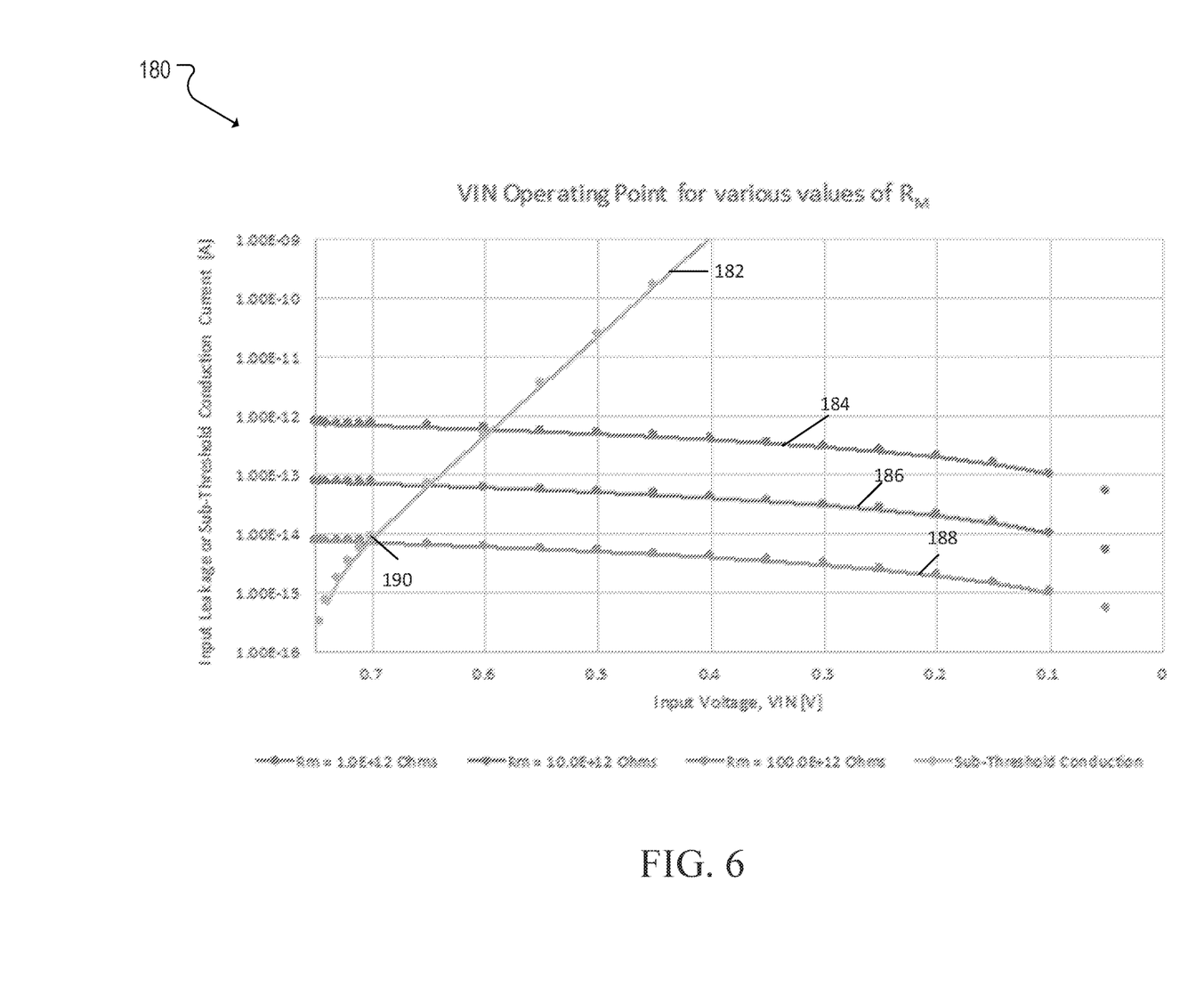
FIG. 6 is a diagram of VIN operating points for various values of Rm.

Referring to FIG. 6, diagram 180 shows example VIN Operating points for various values of Rm. In this example, line 182 represents the sub-threshold conduction current $I_D$ and $V_{REF}=0.75$ V. Line 182 is calculated using Equations 1-4 and a W/L ratio of 2. Lines 184, 186, 188 represent various impedance levels—Rm values for various input voltages. The points where lines 182 crosses the various impedance level lines 184, 186, 188 are the operating points achieved in steady state operation. For example, line 182 crosses line 188 at point 190, which represents that Vin=0.7 Volts, when Rm=100.0 E+12 Ohms and VREF=0.75V.

Switch Operation for Startup and Recovery:

Drain Current of MOSFET in Saturation Region during startup and recovery times is given in Equation 5. This is exponentially related to the difference between VGS and VTH, the threshold voltage of the device (e.g., a device represented by diagram 100) in the transmission gate. As a result, significantly more current is available than in sub-threshold conduction, allowing for the transducer capacitance to be quickly charge during startup and recovery times. The gate voltage is controlled by the gate drive circuits shown in FIGS. 1 and 2.

$$I_{D,SAT} = \frac{\mu_n C_{OX}}{2}\frac{W}{L}(V_{GS}-V_{TH})^2 \quad \text{Equation 5}$$

ESD Protection: ESD Protection on VIN

The ESD Diodes shown in FIG. 1 and FIG. 2 provide protection for the input devices of the amplifier and for the transmission gate/switch devices depicted in those same figures.

Figure 7:
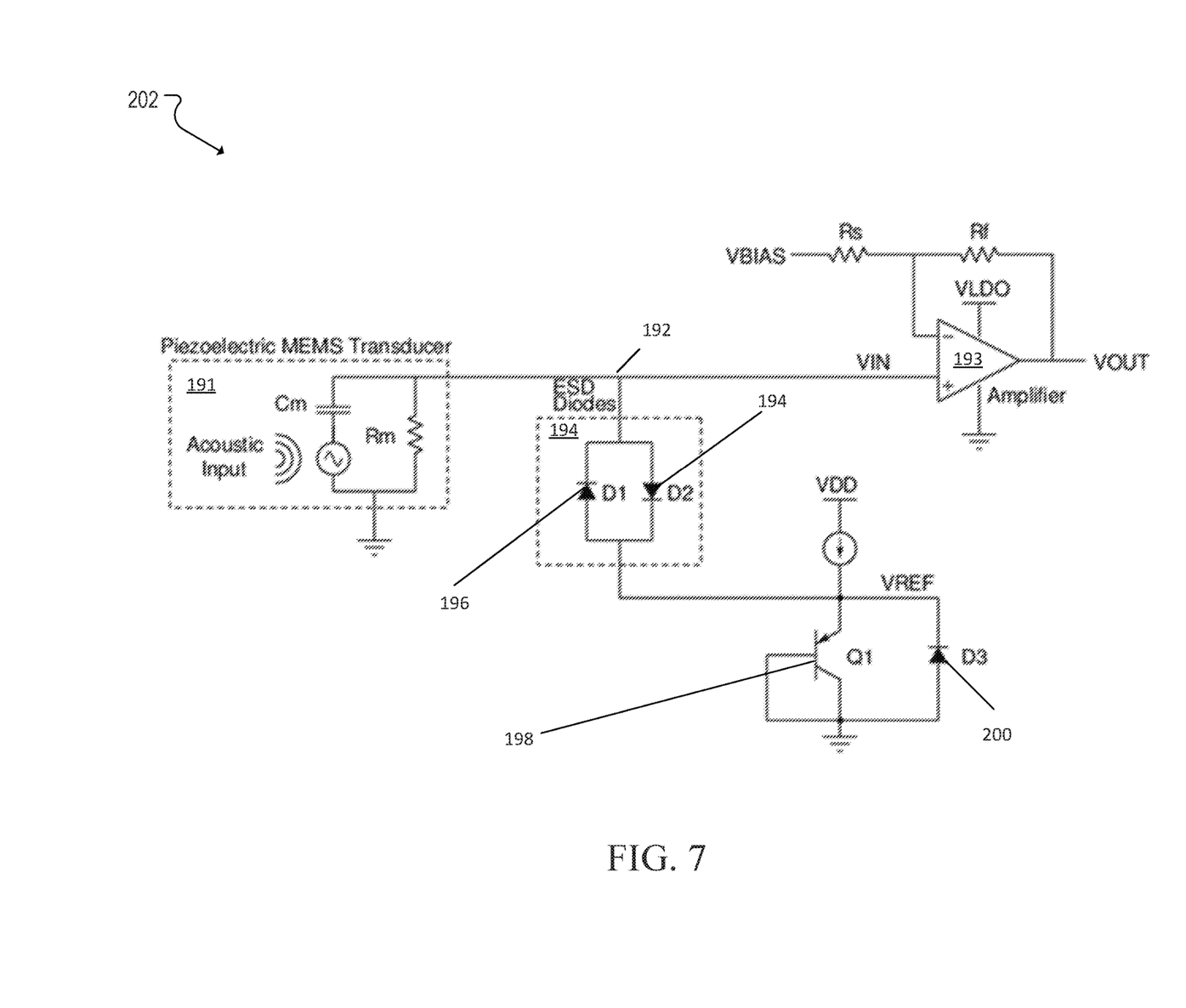
FIG. 7 is a diagram of an ESD network for VIN.

Referring to FIG. 7, equivalent circuit diagram 202 illustrates the devices that generate VREF from FIGS. 1 and 2. Equivalent circuit diagram 202 includes (via representation of the equivalent circuits for each of the following components) ESD protection network 194 for input voltage (Vin) node 192, transducer 191, amplifier 193, transistor 198 (Q1) and diode 200. ESD protection network 194 for the VIN node 192 can be subjected to both positive and negative ESD strikes. When a positive strike occurs on VIN, diode 194 (D2) and transistor 198 (Q1) are both turned on, and dissipate the charge to ground. Similarly, when a negative ESD strike occurs on VIN, diode 196 (D1) and diode 200 (D3) both turn on, again dissipating the charge to ground. A primary design consideration for the size of diodes 196, 198, D1 and D2—respectively, which determine the total ESD immunity achievable, is minimization of capacitance so as to maintain high performance of transducer 191 to amplifier 193. It can be extrapolated that maximizing performance could minimize ESD performance, however in practice, there is ample design space to achieve significant ESD protection, 1 kV immunity HBM, and still maintain high performance within design goals and requirements.

Figure 8:
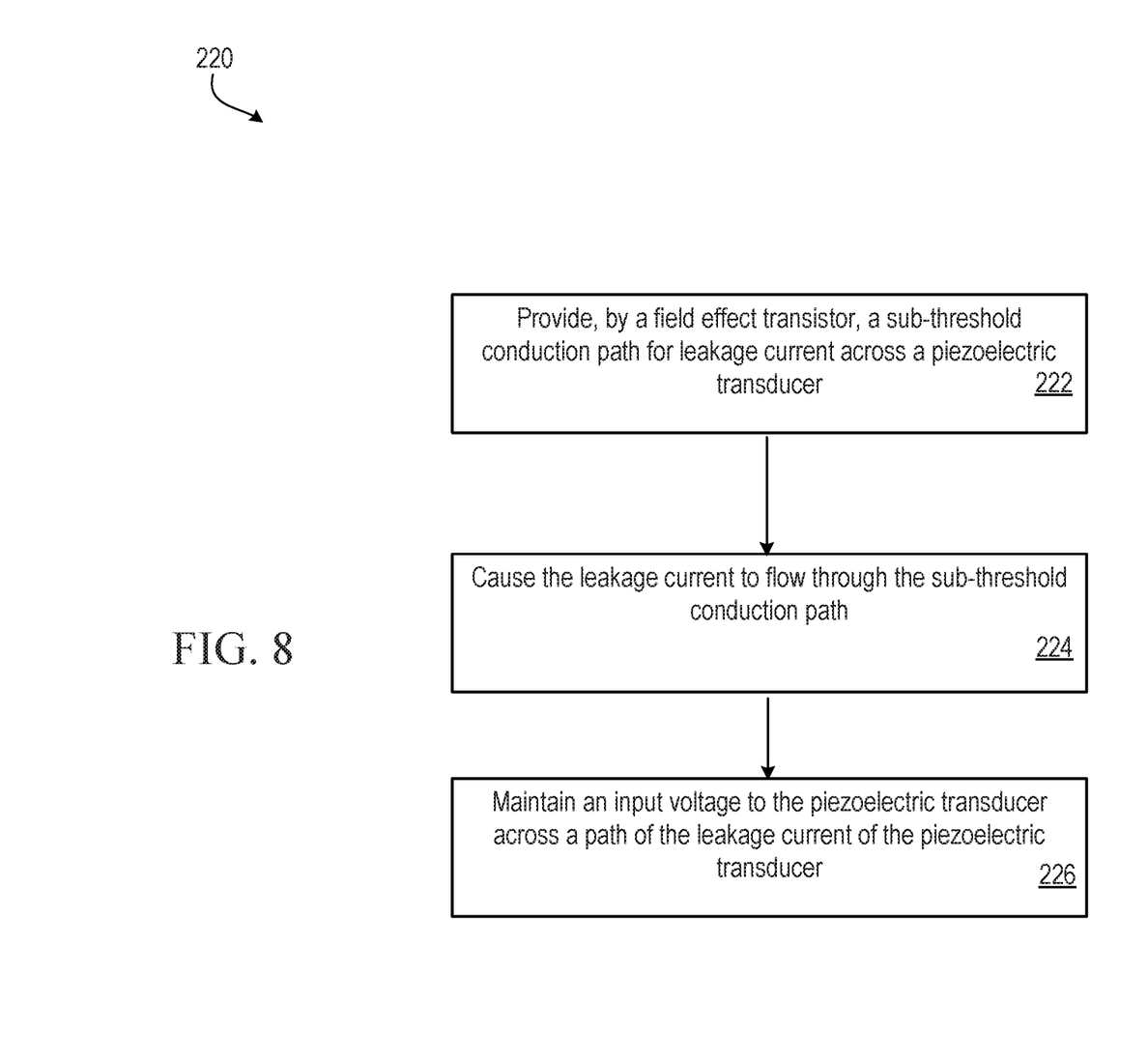
FIG. 8 is a flowchart of a process for providing a sub-threshold conduction path for leakage current across a piezoelectric transducer.

Referring to FIG. 8, flowchart 220 illustrates operations performed by a device in an input biasing scheme for a piezoelectric transducer. In operation, the device (e.g., a packaged transducer including an integrated circuit with a transducer and a FET) provides (222), by a field effect transistor, a sub-threshold conduction path for leakage current across a piezoelectric transducer. The device causes (224) the leakage current to flow through the sub-threshold conduction path. The device maintains (226) an input voltage to the piezoelectric transducer across a path of the leakage current of the piezoelectric transducer. In this example, each of a width and a length of a gate of the field effect transistor has a size in accordance with the sub-threshold conduction path being configured to substantially maintain the input voltage to the piezoelectric transducer across the path of the leakage current of the piezoelectric transducer. In this example, the device also supplies a reference voltage to the field effect transistor, and maintains the input voltage to be in accordance with the reference voltage.

The input biasing scheme described herein can be provided and/or implemented for various types of devices, including, e.g., acoustic devices, microphones, hydrophones and so forth. Additionally, various types of the piezoelectric transducers include, without limitation, a piezoelectric sensor, a piezoelectric resonant sensor, an acoustic transducer, a pressure sensor, a chemical sensor, an ultrasonic sensor, an inertial sensor, and so forth.

Implementations of the subject matter and the functional operations described in this specification can be implemented in digital electronic circuitry, in tangibly-embodied computer software or firmware, in computer hardware, including the structures disclosed in this specification and their structural equivalents, or in combinations of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

While this specification contains many specific implementation details, these should not be construed as limitations on the scope of any of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

Other embodiments are within the scope and spirit of the description and the claims. For example, due to the nature of software, functions described above can be implemented using software, hardware, firmware, hardwiring, or combinations of any of these. Features implementing functions may also be physically located at various positions, including being distributed such that portions of functions are implemented at different physical locations. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

A number of embodiments of the invention have been described. Nevertheless, it will be understood by one of ordinary skill in the art that various modifications may be made without departing from the spirit and scope of the claims and the techniques described herein.

What is claimed is:

1. A device comprising:
    a piezoelectric transducer;
    a field effect transistor (FET) configured to provide a sub-threshold conduction path for leakage current across the piezoelectric transducer;
    wherein the FET comprises a gate;
    wherein each of a width and a length of the gate has a size in accordance with the sub-threshold conduction path being configured to substantially maintain an input voltage to the piezoelectric transducer across a path of the leakage current of the piezoelectric transducer.

2. The device of claim 1, wherein the piezoelectric transducer is associated with a leakage resistance ($R_m$) that produces the leakage current, when in operation;
    wherein each of the width and the length of gate is of a size for producing a sub-threshold drain current ($I_D$) of the FET that is substantially in accordance with the leakage current.

3. The device of claim 2, wherein the FET is configured to provide the sub-threshold conduction by each of the width and the length of the gate being of a size for producing the sub-threshold drain current ($I_D$) of the FET that is substantially in accordance with the leakage current.

4. The device of claim 1, wherein the FET is configured to act as a switch with an on state and an off state.

5. The device of claim 4, wherein the FET is configured, when in the on state, to provide a lower impedance path between the input voltage and a reference voltage, relative to an impedance of the path between the input voltage and the reference voltage, when the FET is in the off state, to provide for charging of the piezoelectric transducer.

6. The device of claim 4, wherein the FET is configured, when in the off state, to provide the sub-threshold conduction path.

7. The device of claim 1, further comprising:
    a reference voltage source for providing a reference voltage; and
    an amplifier configured for operation at the reference voltage or at another voltage within a predefined range of the reference voltage;
    wherein each of the width and the length of the gate have a size in accordance with the sub-threshold conduction path being configured to substantially maintain the input voltage at the reference voltage.

8. The device of claim 1, wherein the piezoelectric transducer comprises a beam with a first electrode layer, a piezoelectric layer and a second electrode layer, wherein a top surface of the beam is associated with surface conduction that causes the leakage current across the piezoelectric transducer when the piezoelectric transducer is under bias.

9. The device of claim 7, wherein a leakage current across the piezoelectric transducer is associated with the reference voltage.

10. The device of claim 1, wherein the piezoelectric transducer comprises a first plate and a second plate, and wherein a leakage current is associated with a voltage differential across the first and second plates.

11. The device of claim 1, wherein the piezoelectric transducer comprises a beam with a first electrode layer, a piezoelectric layer and a second electrode layer, wherein a material property of the piezoelectric layer causes the leakage current across the piezoelectric transducer.

12. The device of claim 1, wherein the piezoelectric transducer comprises:
- a piezoelectric sensor;
- a piezoelectric resonant sensor;
- an acoustic transducer;
- a pressure sensor;
- a chemical sensor;
- an ultrasonic sensor; or
- an inertial sensor.

13. The device of claim 1, wherein the device comprises an acoustic device, a microphone or a hydrophone.

14. The device of claim 1, further comprising:
a gate drive circuit configured to deliver a voltage to gate of the FET to charge a capacitance of the piezoelectric transducer.

15. The device of claim 1, further comprising:
an amplifier; and
one or more electrostatic discharge (ESD) diodes to protect the amplifier from ESD.

16. A device comprising:
an integrated circuit;
a piezoelectric transducer on the integrated circuit; and
input bias circuitry on the integrated circuit, wherein the input bias circuitry is electrically isolated from the piezoelectric transducer, and wherein the input bias circuitry is configured to maintain one or more steady state operating characteristics of the piezoelectric transducer by providing a sub-threshold conduction path for sub-threshold current of the piezoelectric transducer.

17. The device of claim 16, wherein at least one of the one or more steady state operating characteristics includes an input voltage of the piezoelectric transducer being in accordance with a reference voltage of the device.

18. The device of claim 16, wherein the input voltage of the piezoelectric transducer being in accordance with the reference voltage of the device comprises the input voltage of the piezoelectric transducer being substantially equal to a reference voltage of the device.

19. A method comprising:
providing, by a field effect transistor, a sub-threshold conduction path for leakage current across a piezoelectric transducer; and
maintaining an input voltage to the piezoelectric transducer across a path of the leakage current of the piezoelectric transducer;
wherein each of a width and a length of a gate of the field effect transistor has a size in accordance with the sub-threshold conduction path being configured to substantially maintain the input voltage to the piezoelectric transducer across the path of the leakage current of the piezoelectric transducer.

20. The method of claim 19, further comprising:
causing the leakage current to flow through the sub-threshold conduction path.

21. The method of claim 19, wherein maintaining comprises:
supplying a reference voltage to the field effect transistor; and
maintaining the input voltage to be in accordance with the reference voltage.

* * * * *